United States Patent [19]

Burnham et al.

[11] Patent Number: 4,727,556

[45] Date of Patent: Feb. 23, 1988

[54] SEMICONDUCTOR LASERS FABRICATED FROM IMPURITY INDUCED DISORDERING

[75] Inventors: Robert D. Burnham, Palo Alto; Robert L. Thornton, East Palo Alto, both of Calif.

[73] Assignee: Xerox Corporation, Stamford, Conn.

[21] Appl. No.: 814,825

[22] Filed: Dec. 30, 1985

[51] Int. Cl.$^4$ .............................................. H01S 3/19
[52] U.S. Cl. ...................................... 372/50; 372/45; 372/46; 357/17
[58] Field of Search ...................... 372/44, 45, 46, 50; 357/17

[56] References Cited

U.S. PATENT DOCUMENTS

| Re. 31,806 | 1/1985 | Scifres et al. | 372/50 |
| 4,378,255 | 3/1983 | Holonyak et al. | 148/1.5 |
| 4,603,421 | 7/1986 | Scifres et al. | 372/50 |

OTHER PUBLICATIONS

W. Streifer et al., "Phased Array Diode Lasers", Laser Focus/Electro-Optics, Jun. 1984.
J. Katz et al., "Supermode Discrimination in Phased-Locked Arrays of Semiconductor Lasers", IEEE International Semiconductor Conference in Brazil, Jul. 1984.
Twu et al., "High Power Coupled Ridge Waveguide Semiconductor Laser Arrays", APL, vol. 45(7), pp. 709–711 (Oct. 1, 1984).
S. Mukai et al., "Fundamental Mode Oscillation . . . Laser Array", APL, vol. 45(8), pp. 834–835 (Oct. 15, 1984).

Primary Examiner—James W. Davie
Assistant Examiner—Georgia Y. Epps
Attorney, Agent, or Firm—W. Douglas Carothers, Jr.

[57] ABSTRACT

A semiconductor laser having a single lasing element or multiple lasing elements is provided with a structural feature in at least one cladding region of the laser that permits partial compositional disordering upon the application of impurity induced disordering (IID) techniques, which disordering is of sufficient magnitude to bring about deformity in the compositional structure of the deposited layer(s) of the laser resulting in changes in the refractive index properties of the induced disordered regions compared to adjacent and remaining undisordered regions thereby creating optical cavities functioning as optical waveguides for propagating radiation generated upon lasing. The structural feature that may be utilized may be a disordering layer having low refractive index properties but not being sufficiently thin to exhibit quantum size effects. Such a feature may comprise a thin layer, e.g. of GaAlAs of high Al content or may comprise an edge or interface established between a high refractive index cladding layer and a lower refractive index cladding layer of a multiple cladding heterostructure.

18 Claims, 7 Drawing Figures

SEMICONDUCTOR LASERS FABRICATED FROM IMPURITY INDUCED DISORDERING

CROSS-REFERENCE TO RELATED APPLICATIONS

This application contains subject matter related to the subject matter of patent application Ser. No. 736,040, filed May 20, 1985 and patent application Ser No. 814,863, filed Dec 30, 1985, both assigned to the same assignee herein.

BACKGROUND OF THE INVENTION

This invention relates to semiconductor lasers with a structural design fabricated after device growth utilizing impurity induced disordering (IID). The present invention represents an improved semiconductor laser of the single or multiple emitter type utilizing impurity induced disordering (IID) techniques in regions not specifying, utilizing or otherwise requiring a quantum well feature.

Single emitter lasers generally of the III-V material regime, e.g., GaAs/GaAlAs, have a designed higher refractive index cavity which is formed between laterally adjacent regions having regions of comparatively lower refractive index. It is known to produce such optical cavities by means of nonplanar growth mechanisms, such as a channel or mesa in the laser substrate or by means of diffusion disordering as exemplified in U.S Pat No. 4,378,255 to Holonyak. As taught in this patent, a semiconductor structure containing a quantum well feature such as a multiple quantum well, undergoes compositional disordering due to impurity diffusion. Diffusion of an impurity into spatially separated regions of the quantum well feature will cause an intermixing of Al and Ga in the well feature so that the average refractive index through the region of these layers subjected to disordering by diffusion will have a lower index of refraction compared to undisordered regions including the central region between the designated spatially separated regions. Thus, the central region may be utilized as an optical waveguide cavity under lasing conditions.

Phased array semiconductor lasers comprise a plurality of closed coupled or spaced emitters on the same integral structure or substrate. Examples of such phased array lasers are illustrated in U.S. Pat. No. 4,255,717, now U.S. Pat. No. Re. 31,806, and in an article of William Streifer et al, entitled "Phased Array Diode Lasers", published in the June 1984 Issue of *Laser Focus/Electro-Optics*. The emitters of such a laser are represented by the periodically spaced current confinement means, e.g., stripes, for current pumping and establishment of spaced optical cavities in the active region of the structure. The current confinement means may be interconnected or closely spaced to a degree that the optical mode established in each of the lasing cavities below a respective current confinement means couples to its neighboring optical modes, i.e., the evanescent wave overlaps into adjacent optical lasing cavities. The array of optical fields produced become locked in phase, and, if the phase difference between adjacent current confinement means is zero, the lateral radiation pattern in the far field will comprise a single lobe. However, as explained in the above mentioned article, the phased array laser does not operate in a single mode but rather generally operate with two or more lobes in the far field pattern. The phase relationship between adjacent optical modes is not under independent control and the phases will adjust themselves in a manner toward minimizing laser threshold current. In most cases, it appears that the lasing mode favored is a supermode wherein the optical field between adjacent optical emitters passes through zero. This is because in most real refractive index lasers as well as many gain guided lasers, pumping is reduced at locations between the laser emitters requiring overall reduced current pumping.

Phased array lasers have high utility due to their high power output. It is preferred that the power be concentrated in a single lobe, i.e., in the 1st or fundamental supermode. The reason is that a substantial majority of laser applications require power in a single far field lobe. If lasing is experienced in more than one lobe, measures are taken to diminish or otherwise attempt to eliminate or block off the other operating lobes in the far field pattern.

Recently, there has been much discussion relating to phase locked array lasers or phased array lasers where efforts have been established to discriminate among the supermodes and provide fundamental supermode selection. One such suggestion was at the IEEE 9th Conference in Brazil, July, 1984 wherein J. Katz et al presented a talk on supermode discrimination by controlling lateral gain distribution along the plane of the lasing elements by incorporating a separate contact to each laser array element and tailoring the currents through the array laser elements. The abstract for the talk is found in the Proceedings of the Conference at pages 94 and 95 entitled "Supermode Discrimination in Phase-Locked Arrays of Semiconductor Laser Arrays".

More recently in the articles of Twu et al entitled "High Power Coupled Ridge Waveguide Semiconductor Laser Arrays", *Applied Physics Letters*, Vol. 45(7), pp. 709-711 (Oct. 1, 1984) and of S. Mukai et al entitled "Fundamental Mode Oscillation of Buried Ridge Waveguide Laser Array", *Applied Physics Letters*, Vol. 45(8), pp. 834-835 (Oct. 15, 1984). These articles suggest discrimination among the supermodes to obtain the single lobe fundamental supermode by employing index guided ridge waveguide structure wherein the laser elements are uniformly pumped with the optical field mainly confined to the ridge region of the structure while higher gain is experienced in the valley or coupling regions to induce inphase operation, i.e., 0° phase, and promotion of fundamental supermode operation.

Further techniques to discriminate among supermodes are illustrated in U.S. patent application Ser. No. 736,040 filed May 20, 1985, entitled "Phased Array Semiconductor Laser With Preferred Emission in the Fundamental Supermode" and assigned to the same assignee herein. The techniques proposed in this application relate to the use of impurity induced disordering (IID) in a manner to enhance the amount of gain experienced in regions between adjacent optical cavities of lasing elements by spatially modulating the optical overlap of the optical field of each of the laser elements across the array to thereby favor the fundamental supermode over other potential modes. As previously mentioned, advances have been made in the art to better delineate the bandgap and refractive indices properties in a semiconductor device by disordering quantum well features which have been epitaxially deposited as part of a semiconductor device. An example of the foregoing is U.S. Pat. No. 4,378,255 wherein there is taught the technique of selectively disordering a multiple quantum structure or superlattice in a semiconductor device via a zinc diffusion through the quantum well structure thereby causing an upward shifting of the bandgap of the well regions of the quantum structure compared to regions of the multiple quantum well structure where disordering has not taken place. Such diffusion can be generally carried out in a temperature range of 500° C.–600° C., which is lower than the epigrowth temperature which is about 750° C. Such disordering is also possible with other elements such as Si, Ge, Sn and S but at higher temperatures, e.g., about 675° C. or above. Further, disordering is possible through implantation of elements acting as shallow or deep level impurities, such as, Se, Mg, Sn, O, S, Be, Te, Si, Mn, Zn, Cd, Sn or Cr followed by a high temperature anneal at temperatures optimium to each particular impurity, e.g., 500° C.–900° C. depending upon the type of impurity and best performed in an As environment. It also has been shown possible to disorder by implantation of III-V elements, such as Al. It has also been further shown possible to use a wide variety of elements to bring about disordering through implantation and annealing, e.g. the inert element, Kr, has been shown to induced disordering. In the case of impurity implant followed by an anneal, the anneal temperatures are relatively at higher temperatures compared to diffusion temperatures, e.g., above 800° C. As use throughout this application, IID herein has reference to both the impurity diffusion technique or the implant/anneal technique both referenced above.

SUMMARY OF THE INVENTION

According to this invention, a semiconductor laser having a single or multiple lasing elements is provided with a structural feature in at least one cladding region of the laser that permits partial compositional disordering upon the application of impurity induced disordering (IID) techniques, which disordering is of sufficient magnitude to bring about deformity in the compositional structure of the deposited layer(s) resulting in changes in the refractive index properties of the induced disordered regions compared to adjacent and remaining undisordered regions thereby creating optical cavities functioning as optical waveguides for propagating radiation generated upon lasing conditions. While there is teaching in the prior art relative to the application IID such as taught in U.S. Pat. No. 4,378,255, it is not necessary for the purposes of fabricating semiconductor structural devices that (1) in the region to be disordered, there must be a quantum well feature, e.g., a single or multiple quantum well feature, exhibiting quantum size effects and (2) a complete or substantially complete disordering need be carried out to obtain desired refractive index profiles necessary to define a waveguide structure in a previously epitaxially grown multilayer semiconductor structure.

The structural feature that may be utilized may be a disordering layer having low refractive index properties but not being sufficiently thin to exhibit quantum size effects. Such a feature may comprise a thin layer, e.g. of GaAlAs of high Al content or may comprise an edge or interface established between a high refractive index cladding layer and a lower refractive index cladding layer of a multiple cladding heterostructure.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
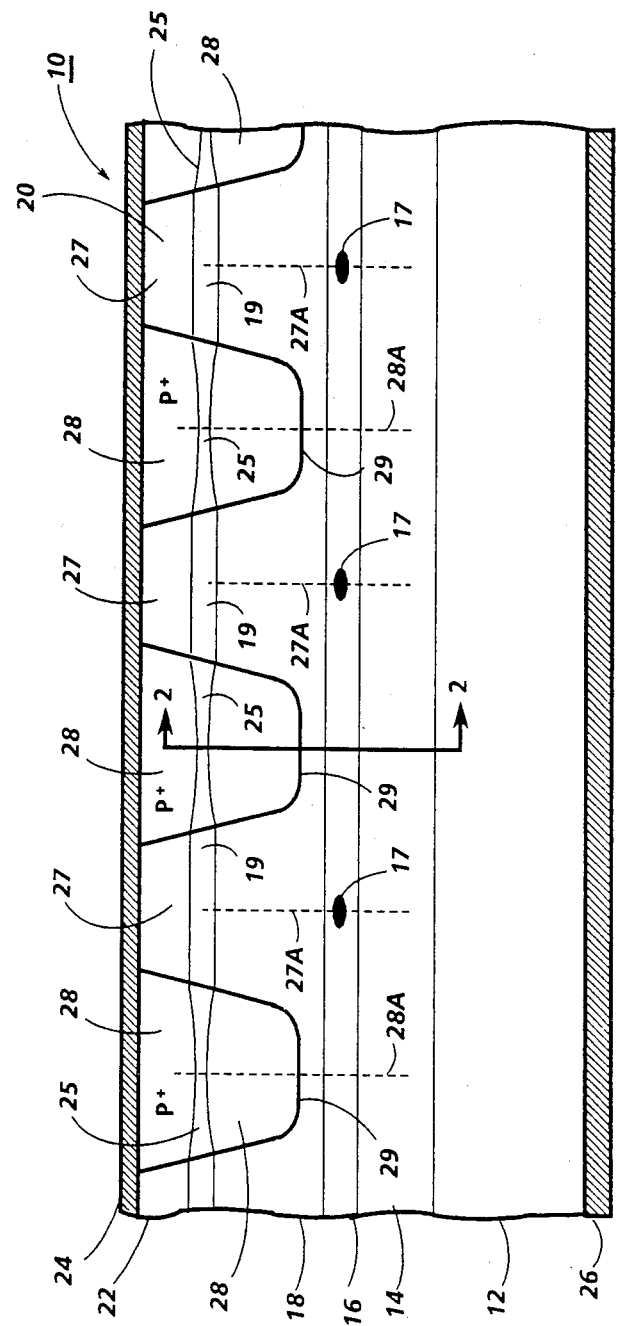
FIG. 1 schematically illustrates a side elevation of a first embodiment of a semiconductor laser utilizing the benefits of this invention.
Figure 2:
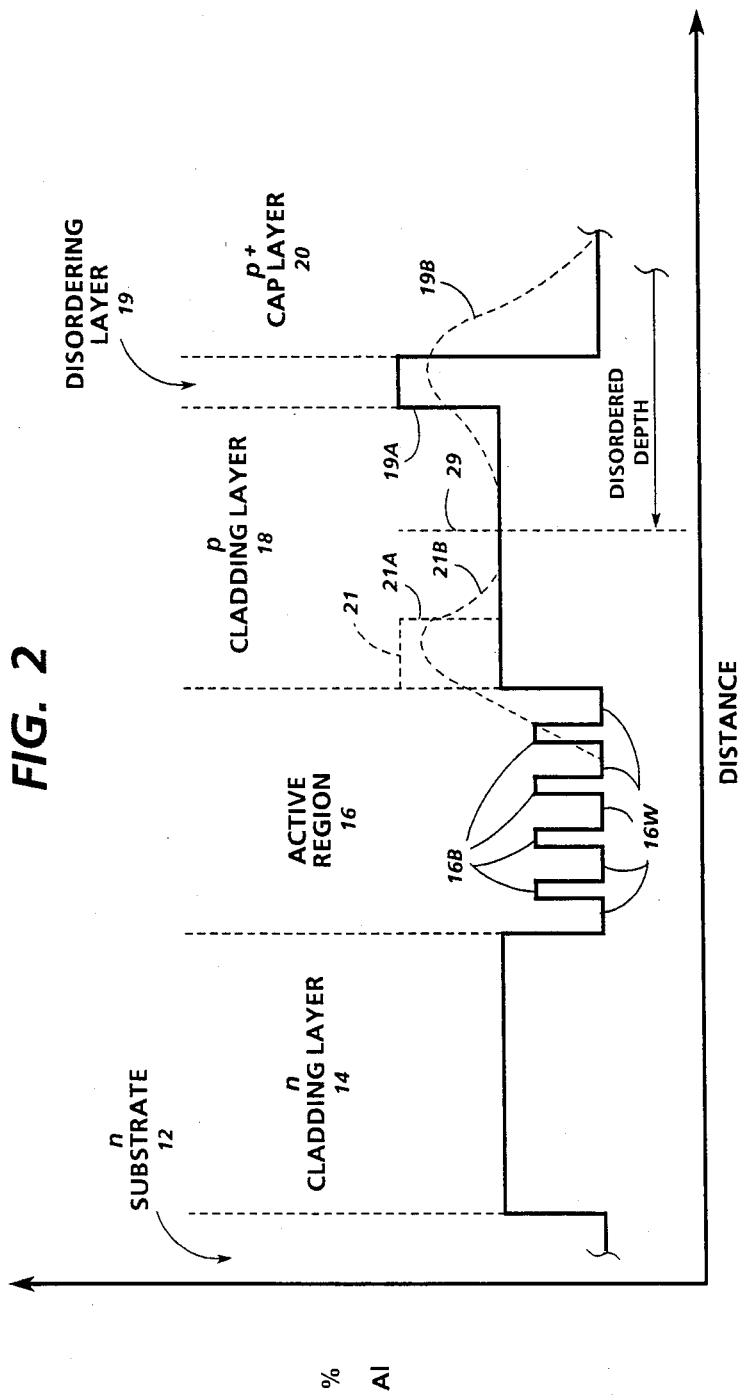
FIG. 2 is an illustration of the compositional profile along the line 2—2 for the laser shown in FIG. 1.

Reference is now made to FIGS. 1 and 2 wherein there is illustrated a first embodiment of a phased array semiconductor laser utilizing the benefits of this invention. FIG. 1 shows a front view of any laser 10 while FIG. 2 represents a cross sectional configuration of the Al compositional percentage profile across the semiconductor layer of the structure as represented by the line 2—2 of FIG. 1. Phase locked array laser 10 is illustrated in the III-V material regime of GaAs/GaAlAs and may be fabricated from a continuous fabricating process such as MO-CVD or MBE, as is well known in the art. Laser 10 comprises a substrate 12 of n-GaAs upon which is epitaxially deposited a cladding layer 14 of n-Ga$_{1-x}$Al$_x$As; an active region 16 being undoped, or p-type or n-type and can comprise any active region structure known in the art including, for example, a GaAs layer in the range of, for example, 50 nm to 500 nm thick, or a single quantum well of either GaAs or Ga$_{1-y}$Al$_y$As where y is very small and x>y, or a multiple quantum well structure of alternating well layers of GaAs or Ga$_{1-y}$Al$_y$As and corresponding barrier layers of either AlAs or Ga$_{1-y}$Al$_y$As, or a separate single or multiple quantum well structure in a separate cavity; a disordering layer 19 of AlAs or Ga$_{1-D}$Al$_D$As where D>x,z; a cladding layer 18 of p-Ga$_{1-z}$Al$_z$As where x, z>y; and cap layer 20 of p+GaAs. As shown in the illustration of FIG. 2, laser 10 has an active region 16 comprising a multiple quantum well structure consisting of wells 16W separated by barriers 16B. There may also be a thin n-GaAs buffer layer deposited on substrate 12 prior to deposition of layers 14–20.

As an example of typical layer thicknesses, cladding layer 14 may be in the range of 0.5 to 1.0 μm. Active region 16 may be a quantum well structure wherein the quantum wells 16W of GaAs may be about 3 nm–50 nm thick and the barriers 16B of Ga$_{1-y}$Al$_y$As may be about 1 nm–10 nm thick with y in the range of 0.1 to 0.4 Disordering layer 19 is at the interface of cladding layer 18 and cap layer 20 and may be 0.5 nm to 2 nm thick with D in the molar range of 0.6 to 1.0, i.e. in the range of high aluminum content. Cladding layer 18 may be in the range of 0.1 to 1.0 μm. Cap layer 20 may be in the range of 0.1 to 1.0 μm.

To form a single cavity laser or a multicavity array laser, impurity induced disordering (IID) techniques known in the art may be utilized, e.g. diffusion disordering or implant/anneal disordering. As previously indicated, diffusion disordering is exemplified in U.S. Pat. No. 4,378,255 to Holonyak wherein there is taught the technique of selectively disordering a multiple quantum well structure in a semiconductor device through the employment of a zinc diffusion causing a change in bandgap of the disordered material. Beside diffusion disordering, the previously mentioned implant/anneal disordering technique disordering is also applicable here. These types of disordering are not limited to species traditionally considered as impurities but also the term IID is intended to extend to include any species that either disorders the crystal through diffusion or damages the crystal, subsequent annealing of the damaged crystal creating the desired disordered crystal.

In discussing the present invention, reference will be made to the use of diffusion disordering relative to a multicavity structure, although it should be realized that a single cavity structure may be formed and/or implant/anneal disordering may also be utilized. To form a multicavity array laser, a $Si_3N_4$ mask is formed on the top surface of cap layer 20 with openings exposing regions of the laser structure to impurity diffusion. The masks protect regions to form a series of laser optical cavities represented by dotted lines 27A or laser elements represented by emitters 17 from disordering process. Cavities 27A are sufficiently close to one another so as to provide optically coupling between adjacent emitters, i.e., the evanescent optical wave of a neighboring optical cavity overlaps into adjacent optical cavities on either side.

Desired current confinement properties and refractive index profile are established by selectively diffusing a high concentration p-type impurity through mask openings into the exposed regions of the laser structure. For example, zinc may be selectively diffused at 700° C. for a sufficient period of time in a semi-sealed graphite boat containing appropriate diffusion sources. This type of process would be typically carried out in a hydrogen flow. The diffusion of zinc into the region of disordering layer 19 causes an intermixing or interdiffusion of Al and Ga in the GaAs-GaAlAs resulting in a GaAlAs alloy of averaged AlAs mole fraction illustrated by the dotted line 19B in FIG. 2. Dotted line 19B illustrates the final condition of the Al profile content of the diffused region of layers 18, 19 and 20. The diffusion of zinc is accomplished at a relatively low temperature, such as, 700° C., and is maintained only so long as to reach the depth of or penetrating into upper cladding layer 18, as indicated at point 29.

Upon completion of the diffusion step, conventional metal contacts 24 and 26 are applied respectively to the surface of cap layer 20 and the bottom surface of substrate 12.

The array of zinc diffused regions 28 serve the dual functions of (1) partially disordering layer 19, as illustrated by the dotted line profile 19B in FIG. 2, to provide an index profile for guiding the propagation of radiation along the optical cavity of each laser element, represented by dotted lines 27A, and (2) providing slightly more preferred current paths at regions 28 through the partially disordered portions 25 of disordered layer 19 for current injection into adjacent optical cavities 27A. Due to the lower index profile provided by IID regions 28 formed between cavities 27A, the structure encourages operation of the array of lasers with a single lobe far field pattern. The resulting laser structure in the plane of active region 16 is such that a plurality of average higher index guiding regions 27 are provided in the nondisordered cavities 27A since disordered layer 19 remains unaffected in these regions as depicted by the profile 19A of FIG. 2. Since the average Al content has been increased across regions 28, as evidenced by profile 19B, regions 27A provide for enhanced waveguiding due to a higher refractive index compared to adjacent regions 28. On the other hand, regions 28 provide areas of slightly higher conductivity or less resistance to current flow, vis a vis nondisordered regions 27, so that with the application of a voltage across metal contacts 24 and 26, current flow will be more confined to and through IID regions 28. Current, however, will also flow through region 27A due to the lateral diffusion of carrier.

The result achieved is that the regions depicted by dotted line 28A will be of higher gain compared to gain obtained at the optical cavity regions depicted by dotted line 27A so that spatial modulation of the optical overlap of the optical field of each of the laser elements is achieved across the array thereby favoring the fundamental or first order supermode over other potential modes of the multi-element array laser 10. As can be determined by a review of the prior art previously cited, the structure of laser 10 achieves the results of those structures with a simpler and easier to fabricate array laser structure, which provides a higher single mode output power capability as well as improved optical field mode control through the use of IID techniques. For example, some array laser structures of the prior art require a proton bombardment definition for current confinement means, which is not necessary relative to the laser structures of this invention.

It should be noted that, as an alternative, a virtually symmetric waveguiding structure may be maintained at regions depicted by optical cavity 27A by designing individual compositional components of the p-side cladding region, including cladding layer 18 and disordering layer 19, to have a combinational refractive index substantially identical to the refractive index as n-side cladding layer 14. This alternative also applies to all subsequent embodiments to be hereinafter discussed.

A disordering layer 19 may likewise be formed in the bottom or n-side cladding region in combination with cladding layer 14. This alternative also applies to all subsequent embodiments to be hereinafter discussed.

Further, disordering layer 19 may be formed in the region of the interface between active region 16 and cladding layer 18, as represented at 21 in FIG. 2 and represented by undisordered composition profile 21A of layer 21. Upon disordering via IID, the Al content profile will take the configuration as approximated by dotted line 21B. It is also a consideration that disordering layer 19 may be provided in other regions of cladding layer 18, e.g., located centrally of either edge of cladding layer 18, as will be exemplified in FIGS. 3 and 4.

Figure 3:
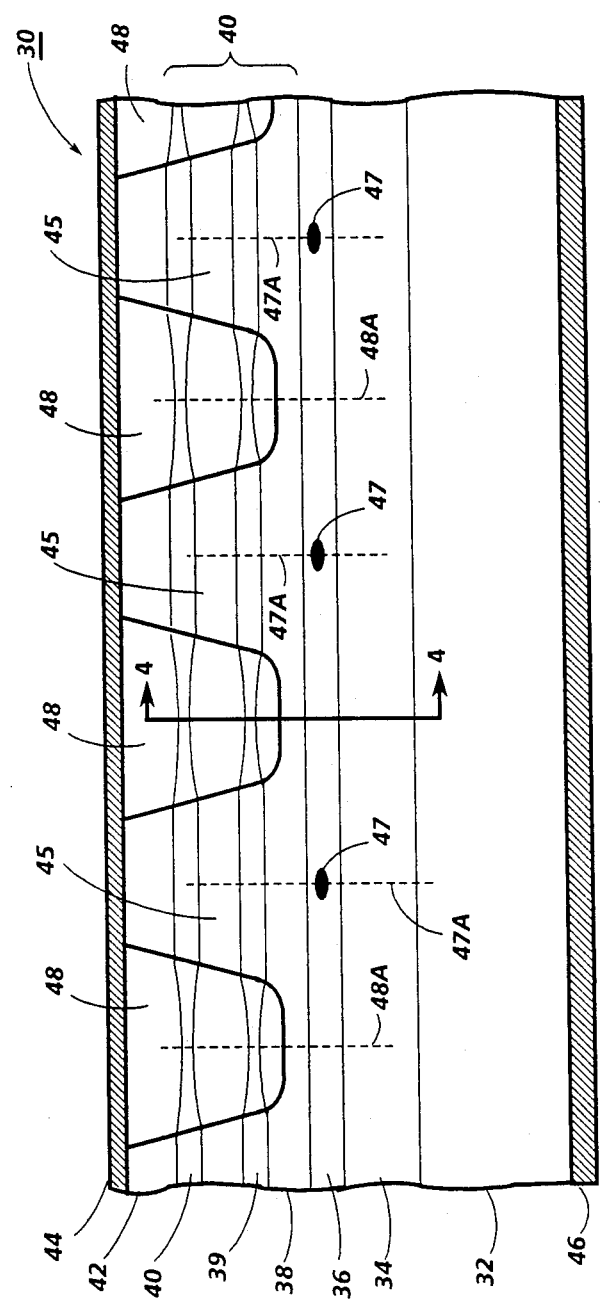
FIG. 3 schematically illustrates a side elevation of a second embodiment of a semiconductor laser utilizing the benefits of this invention.

In FIG. 3, array laser 30 is of similar structure to array laser 10, except that the impurity type of the respective semiconductor layers comprising the laser structure are reversed, the active region configuration is different and there are two disordering layers included in a single cladding layer. Laser 30 comprises a substrate 32 of p-GaAs upon which is epitaxially deposited a cladding layer 34 of p-Ga$_{1-x}$Al$_x$As; an active region 36 being undoped or p-type or n-type and may comprise any active region structure commonly known in the art as previously indicated relative to FIG. 1 and is shown here to specifically comprise a double cladded heterostructure comprising active layer 36A between cladding layers 35 and 37 respectively comprising p-Ga$_{1-y}$Al$_y$As and n-Ga$_{1-y}$Al$_y$As where x>y; a cladding layer 38 of n-Ga$_{1-z}$Al$_z$As where x, z>y; and a cap layer 42 of n+GaAs. Cladding layer 38 includes two disordering layers 39 and 40 introduced during the growth process comprising Ga$_{1-D}$Al$_D$As where D>x, z.

The example of layer thicknesses for the structural layers of laser 30 may be in the ranges exemplified for the corresponding layers of laser 10, including each disordering layer 39 and 40.

Figure 4:
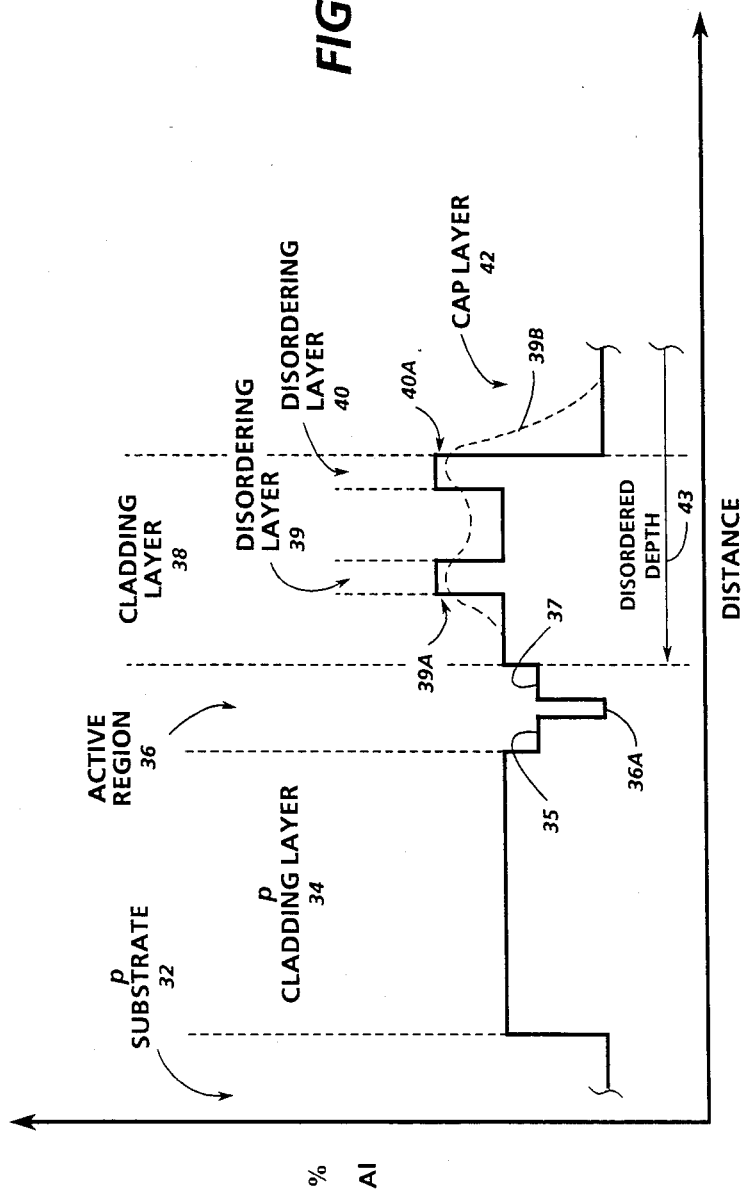
FIG. 4 is an illustration of the compositional profile along the line 4—4 for the laser shown in FIG. 3.

As noted in the compositional profile in FIG. 4, the solid line profile 39A and 40A represent regions of cladding layer 38 that have not been effected by disordering, i.e., cavity regions 47A. Dotted line profile 39B approximates the compositional profile after IID treatment as previously explained relative to FIGS. 1 and 2 in regions 48A of laser 30 wherein an n-type diffusant, e.g., silicon, tin or germanium has been utilized to effectively disorder in a partial manner layers 38 and 39 and extends to a depth indicated by arrow 43 in FIG. 4 without penetrating active region 36.

The array of silicon diffused regions 48 serve the dual functions of (1) disordering to a partial extent disordering layers 39 and 40 to provide an index profile for guiding the propagation of radiation along the optical cavity represented by dotted lines 47A and (2) providing slightly more preferred current paths at regions 48 through the partially disordered portions 43 of layers 39 and 40 for current injection into adjacent optical cavities 47A. Due to the lower index profile provided by IID regions 48 formed between optical cavities 47A, the induced structural architecture encourages operation of the array of lasers with a single lobe far field pattern. Also, if disordering layers 39 and 40 are chosen to be background doped p-type, current injection will be more confined to silicon diffused n-type regions.

The resulting laser structure in the plane of cladding layer 38 is such that a plurality of average higher index guiding regions 45 are provided in the nondisordered cavities 47A. These regions 45 provide for enhanced waveguiding due to a higher refractive index compared to regions 48 due to the higher average of Al compositional level contained across regions 48, as indicated by profile 39B compared to the original profile represented by cladding layer 38 and the undisturbed disordering layer profiles 39A and 40A. On the other hand, regions 48 provide areas of higher conductivity or less resistance to current flow, vis a vis nondisordered regions 45 so that with the application of a voltage across metal contacts 44 and 46, current flow will be more confined to and through IID regions 48. Current will also flow into and through regions 47A due to the lateral diffusion of carriers.

Higher gain will, therefore, be experienced in regions indicated by dotted lines 48A compared to gain achieved in optical cavities 47A so that spatial modulation of the optical overlap of the optical field of each of the laser elements is achieved across the array thereby favoring the fundamental supermode over other potential modes of the multi-element array laser 30.

In connection with the embodiments of both FIGS. 1 and 3, it will be evident to those skilled in the art that in the illustration for laser 10 in FIG. 1, the p+ type diffused regions 28 may be n+ type diffused regions, e.g., silicon, so long as the background doping of disordering layer 19 is p−type. By the same token, for laser 30 in FIG. 2, the n+ type diffused regions 48 may be p+ type diffused regions, e.g., zinc, so long as the background doping of disordering layers 39 and 40 are n-type.

Previous embodiments have illustrated multi-element array lasers. However, the concept of utilizing IID in standard single element laser structures is also equally applicable. In this connection, reference is made to a single laser element of either of the embodiments of FIGS. 1 and 3 wherein a single element laser would consist of cavity region 27A or 47A and two adjacent IID regions 28 or 48, respectively.

Figure 5:
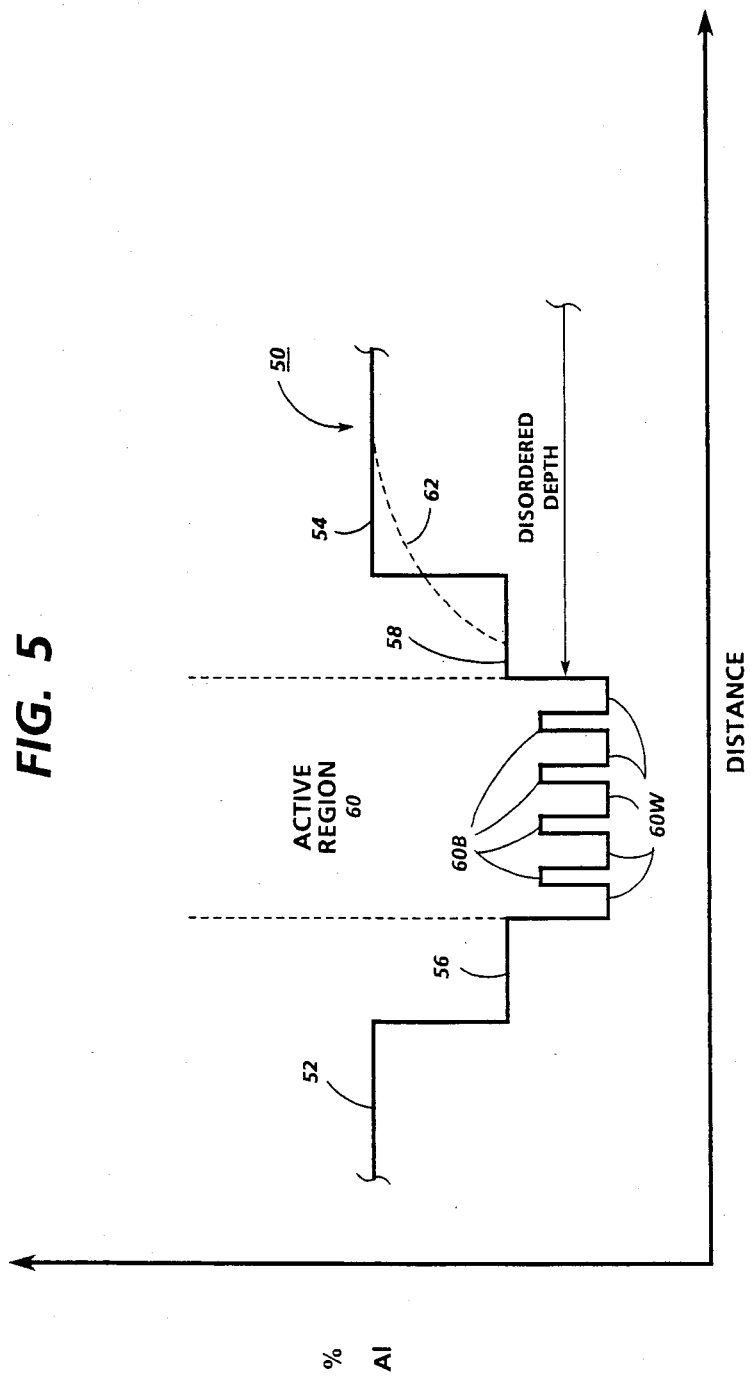
FIG. 5 is a compositional profile for a double cladded heterostructure laser utilizing the benefits of this invention.
Figure 6:
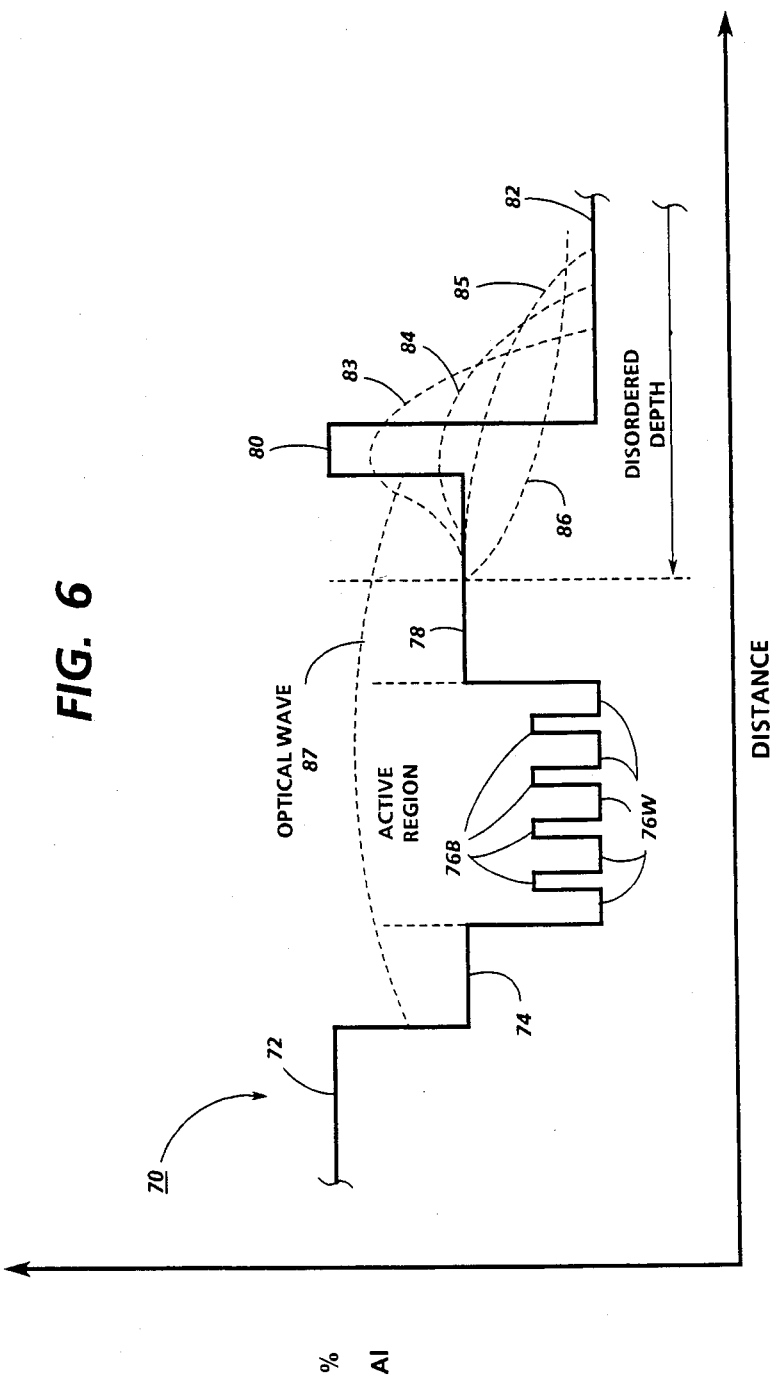
FIG. 6 is a compositional profile for a double cladded heterostructure laser with a disordering layer illustrating the effects of different levels of achievable disordering strength.

Reference is now made to the composition profiles of FIGS. 5 and 6 which illustrate laser configurations wherein IID is sufficiently accomplished in areas of the structure where there is no superlattice or other quantum well feature that is capable of exhibiting quantum size effects.

In FIG. 5, compositional profile 50 for a laser structure, for example, of the GaAs/GaAlAs regime as exemplified in more detail in previous embodiments comprises a double cladded multiple quantum well structure having outer cladding layers 52 and 54, inner cladding layers 56 and 58 and active region 60 comprising a plurality of quantum wells 60W separated by barriers 60B. As an example, outer cladding layers may be in the range of 0.60–0.90 Al content and inner cladding layers may be in the range of 0.30 to 0.60 Al content. In all cases of layers 52–58 including barriers 60B, the compositional content of these layers comprises GaAlAs with varying percentage of Al as represented by profile 50. Wells 60W may be comprised of GaAs or GaAlAs containing a small percentage of Al. Layers 52–60 form an optical cavity region with the outer cladding layers bounded respectively by the semiconductor substrate and cap layer.

An index waveguide optical cavity region is created in this profile by inducing partial disordered regions on a side of the optical cavity by means of IID which is penetrated to a depth of outer and inner cladding layers 54 and 58, as indicated at dotted line 62 in FIG. 5. Dotted line 62 approximates partial disordering that occurs at the interface between cladding layers 54 and 58. In essence, the sharp 90° profile edge at the interface is "knocked off", i.e., the shape interface is reduced to a more gradual change in Al compositional percentage represented by curve 62. In particular, a portion of the Al content of outer cladding layer 54 migrates into the lower Al content, inner cladding layer 58. As a result, the average Al content across layers 54 and 58 in the IID regions will be higher in diffused regions compared to that in nondisordered optical cavity regions, which regions retain the initial profile of layers 54 and 58. Therefore, a higher index profile will be established in optical cavity regions compared to the adjacent IID regions to provide the necessary waveguiding mechanism and ingredients for optical cavity operation.

In FIG. 6, the compositional profile 70 for another laser structure, for example, of the GaAs/GaAlAs regime represents a double cladded multiple quantum well structure comprising outer cladding layer 72, inner cladding layer 74 active region 76 comprising a plurality of quantum wells 76W separated by barriers 76B, cladding layer 78, disordering layer 80, and outer cap layer 82. As a specific example, layer 72 may comprise n-$Ga_{1-x}Al_xAs$, layers 74 and 78 may respectively comprise n-$Ga_{1-y}Al_yAs$ and p-$Ga_{1-y}Al_yAs$, barriers 76B may comprise $Ga_{1-z}Al_zAs$, wells 76W may comprise GaAs, disordering layer 80 may comprise p-$Ga_{1-x}Al_xAs$ and cap layer 82 may comprise p-GaAs. In the case of this example, $x>y>z$.

Disordering layer 80 may be in the range of 0.5 nm to 2 nm thick and represents the other outer cladding layer to form an optical cavity within the framework of the confines established by active region 76 and inner cladding layers 74 and 78 for propagation of an optical wave in the cavity as represented by dotted line 87.

In regions adjacent both sides of the cavity to be formed, IID regions are created in the manner as previously discussed. By varying the concentration of the impurity diffused or implanted, the extent of the disordering profile can be varied thereby varying the size or extent of optical wave 87. The higher the concentration, the greater the magnitude of disordering to the disordering layer 80A as represented monotonically by the series of dotted lines 83-86. With the increase or disordering concentration comprises an increase in disordered magnitude starting with profile 83 and ending with, for example, profile 86. To be noted is that the compositional average of Al migrating into high index layer 82 may be varied by the impurity concentration so that the formed IID regions have a predetermined change in refractive index profile compared to undisordered regions, the magnitude of the change being selectively induced via the IID process.

Figure 7:
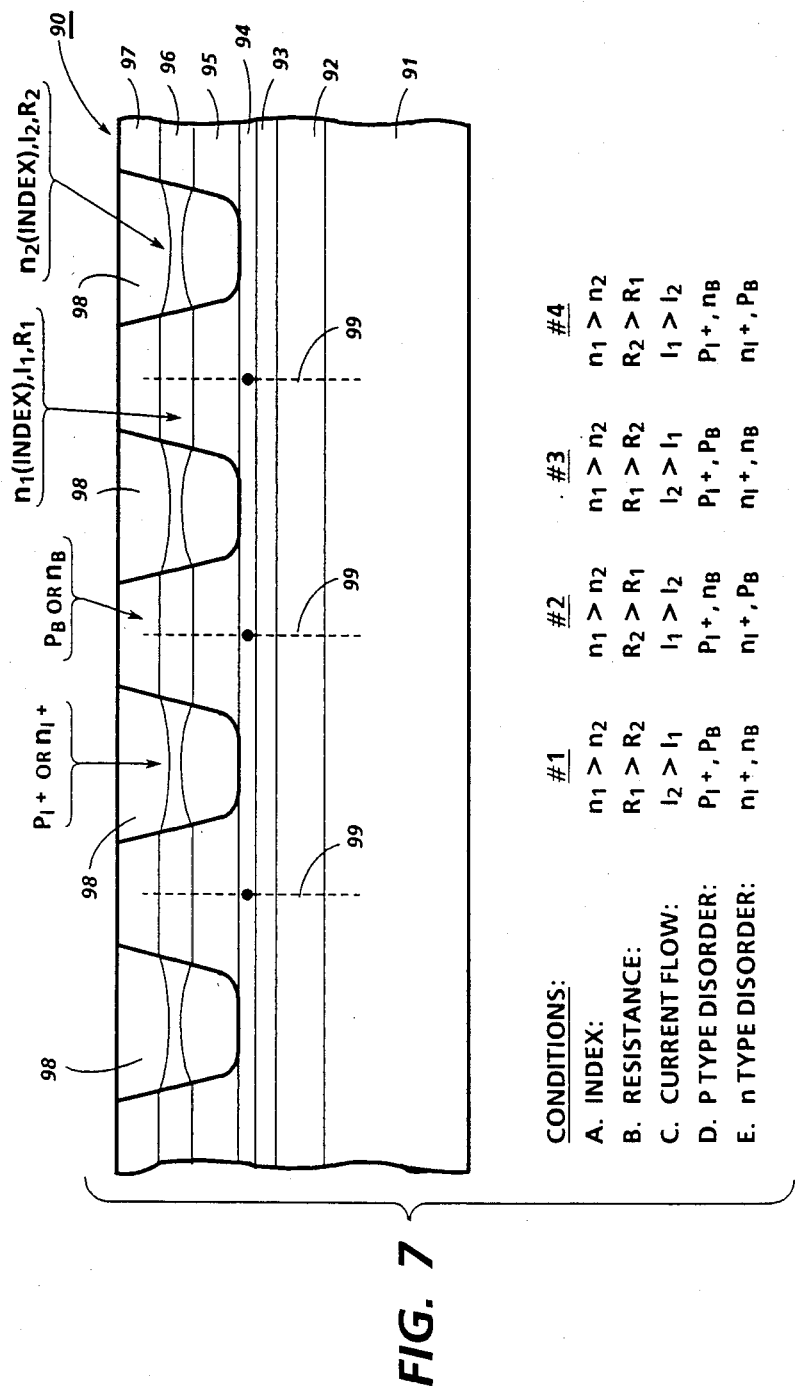
FIG. 7 is a composite illustration of conditions of n-type and p-type disordering for a laser structure having a compositional profile like that shown in FIG. 5 refractive to provide desired current flow and refractive index characteristics for a multi-emitter phased array laser having preferred fundamental supermode operation.

Reference is now made to FIG. 7 wherein there is disclosed a composite illustration for varying conditions of n-type and p-type disordering for a laser structure of the type similar to that shown in FIG. 5 and having multiple lasing elements. Laser 90 comprises substrate 91 of GaAs; outer cladding layer 92 of $Ga_{1-x}Al_xAs$; inner cladding layer 93 of $Ga_{1-y}Al_y$ As where $x>y$; active region 94 which be comprised of any one of the active regions previously discussed relative to prior embodiments; inner cladding layer 95 of $Ga_{1-y}Al_yAs$; outer cladding layer 96 of $Ga_{1-x}Al_xAs$ where $x>y$; and cap layer 97 of GaAs. As an example, x may be in the range of 0.60-0.90 and y may be in the range of 0.30 to 0.60. For the purposes of illustration of the four sets of background doping and impurity disordering, the outer cladding layer 96 is designated to have a refractive index of $n_1$, a current capacity of $I_1$ and a resistance to current flow of $R_1$. Cladding layer 96 also may have a background doping level of $p_B$ or $n_B$.

Array laser 90 in optical cavity regions 99 may be either $p_B$ or $n_B$ background impurity with the resultant characteristics of a refractive index of $n_1$, a current capacity of $I_1$ and a resistance to current flow of $R_1$. IID regions 98 are established by either $p_I+$ or $n_I+$ impurity induced diffusion with the resultant characteristics of a refractive index of $n_2$, a current capacity of $I_2$ and a resistance to current flow of $R_2$. In FIG. 7, the table illustrates the proper conditions for situations #1, #2 and #3 and #4 relative the refractive index, resistance and current flow characteristics are set forth for given background impurity and induce impurity conditions in situations for p-type disordering and for n-type disordering in order to achieve desired characteristics for preferred fundamental supermode operation, i.e., with the IID regions 98 being areas of higher gain compared to optical cavity regions 99 of the individual lasing elements, regions 99 being areas of comparatively higher refractive index.

Although the laser geometries illustrated for the embodiments of this invention are planar structures, it will be evident to those skilled in the art that the impurity induced disordering regions provided in those structures may also be utilized in nonplanar laser geometries as well.

Although all the foregoing embodiments have been described in connection with semiconductors of the GaAs and GaAlAs regime, other light emitting materials may be employed, such as InGaAsP, GaAlAsP, InGaAlP, InGaAlAsP, GaAlSb and appropriate II–VI materials, such as, ZnSe/ZnSSe. Further, as indicated in each embodiment illustrated, the active region may comprise a single active layer or, alternatively, may comprise an active region of either single quantum well or multiquantum well.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a semiconductor laser having a plurality of semiconductor layers with at least one lasing element disposed in an optical cavity established therein, said layers including an active region for light wave generation and propagation under lasing conditions and cladding layers formed on the boundary surfaces of said active region, the improvement comprising at least one disorderable layer formed in or at the surface of one of said cladding layers an impurity induced into said disorderable layer laterally adjacent to either side of said optical cavity to cause a partial, vis a vis a complete, interdiffusion of elemental constitutents of said disorderable layer with elemental constitutents of at least one adjacent semiconductor layer to produce partially disordered alloy regions transversely of said disorderable layer having an average lower refractive index profile compared to the original refractive index profile present in said optical cavity thereby creative of an index waveguide for said optical cavity.

2. The semiconductor laser of claim 1 wherein said induced impurity comprises an impurity diffusion.

3. The semiconductor laser of claim 1 wherein said induced impurity comprises an implant/anneal technique.

4. The semiconductor laser of claim 1 wherein said active region comprises a single quantum well.

5. The semiconductor laser of claim 4 wherein said active region is planar.

6. The semiconductor laser of claim 4 wherein said active region is nonplanar.

7. The semiconductor laser of claim 1 wherein said active region comprises a multiple quantum well consisting of alternating wells and barriers.

8. The semiconductor laser of claim 7 wherein said active region is planar.

9. The semiconductor laser of claim 7 wherein said active region is nonplanar.

10. The semiconductor laser of claim 1 wherein said active region comprises a thin active layer having thickness in the range of 0.5 nm to 1 nm.

11. The semiconductor laser of claim 10 wherein said active region is planar.

12. The semiconductor laser of claim 10 wherein said active region is nonplanar.

13. The semiconductor laser of claim 1 wherein said disorderable layer contains wider bandgap constituents compared to the constitutents of semiconductor layers immediately adjacent to said disorderable layer.

14. The semiconductor laser of claim 13 comprising constituents of the GaAs/GaAlAs regime, a major constituent of said disorderable layer comprising Al.

15. The semiconductor laser of claim 14 wherein said disorderable layer comprise $Ga_{1-D}Al_DAs$ and has a Al content of D within the range of 0.60 to 1.0.

16. The semiconductor laser of claim 1 wherein there is a plurality of laser elements having associated optical cavity waveguides established therein forming a phased array laser, said impurity induced into said disorderable layer on laterally adjacent sides of said laser elements to cause a partial, vis a vis a complete, interdiffusion of elemental constituents of said disorderable layer with elemental constituents of at least one adjacent semiconductor layer to produce disordered alloy regions transversely of said disorderable layer having higher gain compared to the gain experienced in said optical waveguides to thereby spatially modulate the current distribution across said array so that the integral of the gain of the optical field present in said active region of said laser elements is higher in said disordered alloy regions compared to said optical waveguides.

17. In a semiconductor laser having at least one lasing element disposed in an optical waveguide relative to an active region for light wave generation and propagation under lasing conditions, a pair of first or inner cladding layers sandwiching said active region, a pair of second or outer cladding layers sandwiching said first cladding layers, an impurity induced into regions laterally adjacent to either side of said laser element to cause a partial, vis a vis a complete, interdiffusion of elemental constituents of said disorderable layer with elemental constituents of at least one of said outer cladding layers to produce partially disordered alloy regions transversely of said disorderable layer having average lower refractive index profile compared to the original refractive index profile present in said said optical waveguide therebetween.

18. The semiconductor laser of claim 17 wherein there is a plurality of laser elements having associated optical waveguides established therein forming a phased array laser, said impurity induced into said disorderable layer on laterally adjacent sides of said laser elements to cause a partial, vis a vis a complete, interdiffusion of elemental constituents of said disorderable layer with elemental constituents of at least one of said outer cladding layers to produce disordered alloy regions transversely of said disorderable layer having higher gain compared to the gain experienced in said optical waveguides to thereby spatially modulate the current distribution across said array so that the integral of the gain of the optical field present in said active region of said laser elements is higher in said disordered alloy regions compared to said optical waveguides.

* * * * *